United States Patent [19]

Ketley

[11] Patent Number: 4,714,726
[45] Date of Patent: Dec. 22, 1987

[54] LOW TEMPERATURE SINGLE STEP CURING POLYIMIDE ADHESIVE

[75] Inventor: Celia H. Ketley, Beverly, Mass.

[73] Assignee: W. R. Grace & Co., Lexington, Mass.

[21] Appl. No.: 870,461

[22] Filed: Jun. 4, 1986

[51] Int. Cl.$^4$ ............................................. C08K 5/15
[52] U.S. Cl. .................................... 524/11; 524/397; 524/439
[58] Field of Search ............... 524/111, 107, 397, 403, 524/439

[56] References Cited

U.S. PATENT DOCUMENTS

| | | | |
|---|---|---|---|
| 3,497,774 | 2/1970 | Hornberger et al. | 317/101 |
| 3,985,928 | 10/1976 | Watanabe et al. | 525/112 |
| 3,990,896 | 11/1976 | Arai et al. | 430/389 |
| 4,323,662 | 4/1982 | Oba et al. | 525/276 |
| 4,401,767 | 8/1983 | Dietz et al. | 501/19 |
| 4,436,785 | 3/1984 | Dietz et al. | 428/427 |
| 4,459,166 | 7/1984 | Dietz et al. | 156/89 |
| 4,519,941 | 5/1985 | Anderson | 524/439 |

FOREIGN PATENT DOCUMENTS 59-149956 8/1984 Japan .

OTHER PUBLICATIONS

"New-Aromatic-Ether Bismaleimide Matrix Resins", By James A. Harvey, Richard P. Chartoff & John M. Butler.
"BMIs-Composites For High Temperatures", By John C. Bittence, Advanced Materials & Processes, 1/86—pp. 23-23.
"Characterization of Bismaleimide System, XU 292, By M. Chaudhari, T. Galvin & J. King—Sampe Journal Jul./Aug. 1985—pp. 17-21.

Primary Examiner—Joseph L. Schofer
Assistant Examiner—N. Sarofim
Attorney, Agent, or Firm—Stacey L. Channing; William L. Baker

[57] ABSTRACT

Disclosed is a silver-filled paste, an electronic assembly comprising a semiconductive device attached to a substrate by said silver-filled paste, and a method of bonding an electronic device to a substrate using said silver-filled paste. The silver-filled paste comprises a silver powder; a resin having the formula:

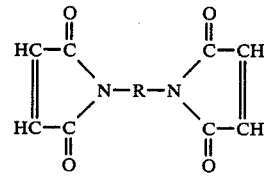

wherein R comprises a divalent linking group; and a solvent for the resin which comprises one or more electron donor groups.

12 Claims, No Drawings

LOW TEMPERATURE SINGLE STEP CURING POLYIMIDE ADHESIVE

BACKGROUND OF THE INVENTION

The invention relates to a silver filled adhesive and more particularly to a single step, low temperature curing silver-filled, polyimide adhesive which is specifically adapted to bond silicon semiconductive devices to substrates.

Existing polyimide die attach adhesives, based on acetylene terminated resins, required a two step cure at high temperature (pre-dry to remove solvent, then final cure to crosslink). Final cure with said existing polyimides has generally required heating over 250° C., which damages some lead frame materials, and which produces very high thermal stresses during cool down. The two step cure process raises costs, slows production, and prohibits use of the adhesive on heat-sensitive parts.

Bismaleimide (BMI) resins have been used extensively as unfilled binder solutions for laminates and adhesives. BMI resins have not hitherto been used in filled paste adhesives due to the inherent instability with many filler solvent combinations. The maleic end groups of BMI resin, the preferred base resin of this invention react much more readily than the acetylene end groups of polyimides used in conventional die attach adhesives. Thus, using bismaleimide, an adhesive has been produced which will yield superior properties when cured at low temperatures (140°-180° C.).

Accordingly, it is a principal object of this invention to provide a low temperature, single step curing silver filled paste.

It is a further object of this invention to provide such a paste which is stable for long periods at or below room temperature.

It is still a further object of this invention to provide such a paste which will give high electrical conductivity, high strength bonds with a minimum of voids and with low thermal stresses after cure.

SUMMARY OF THE INVENTION

This invention provides a silver-filled paste, an electronic assembly comprising a semiconductor device attached to a substrate by said silver-filled paste, and a method of bonding an electronic device to a substrate using said silver-filled paste.

The silver-filled paste of the invention comprises a silver powder; a resin having the formula:

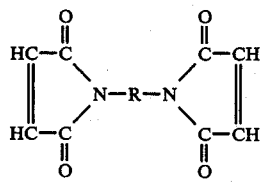

wherein R comprises a divalent linking group; and a solvent for the resin which comprises one or more electron donor groups. The silver-filled paste preferably comprises 50–85% by weight of the silver powder which is preferably in flake form, 15–50% by weight of the resin and 15–30% by weight of the solvent. The solvent preferably comprises an aliphatic ring structure containing an ester or anhydride group and more preferably is butyrolactone or propylene carbonate. In the resin formula, R preferably comprises a divalent linking group which provides an aromatic ring adjacent each of the nitrogen atoms, and more preferably is selected from the group consisting of:

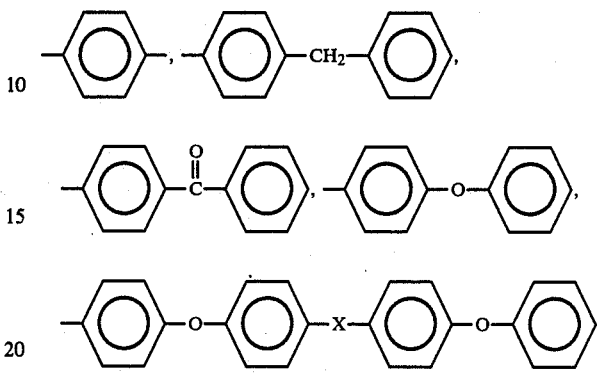

wherein X comprises a linking group such as oxygen, alkylene or carbonyl, and

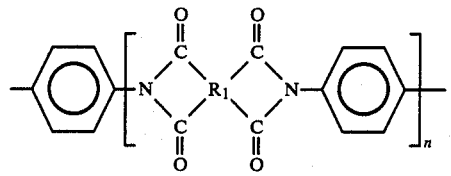

wherein $R_1$ is an aromatic group and n is 1 or 2.

DETAILED DESCRIPTION OF THE INVENTION

This invention is particularly directed toward preparing a silver-filled paste which is specifically adapted to bond an electronic device to a substrate.

The silver-filled paste of the invention is a single step, low-temperature curing paste which comprises a silver powder; a resin having the formula:

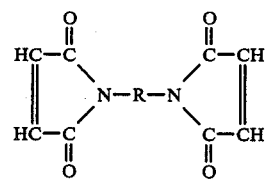

wherein R comprises a divalent linking group which preferably provides an aromatic ring adjacent each of the nitrogen atoms; and a solvent for the resin which comprises one or more electron donors. The silver-filled paste preferably comprises 50–85% by weight of the silver powder, 15–50% by weight of the resin and 15–30% by weight of the solvent.

The silver powder used is preferably finely powdered silver flake in which the major dimension of the silver flake ranges from 5 to 15 microns and the thickness of the flake is about 1 micron.

In the resin formula for the silver-filled paste, R is preferably selected from the group consisting of:

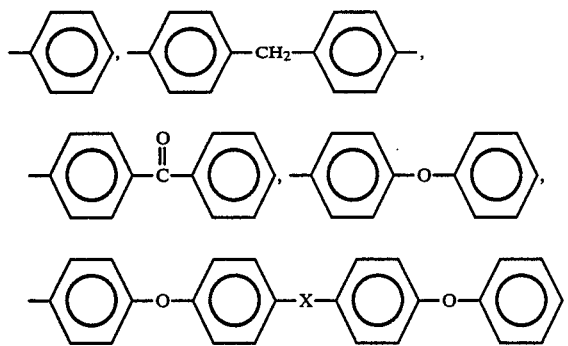

wherein X comprises a linking group such as oxygen, alkylene or carbonyl, and

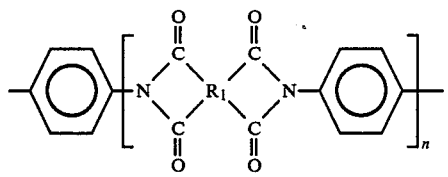

wherein $R_1$ is an aromatic group and n is 1 or 2 such as

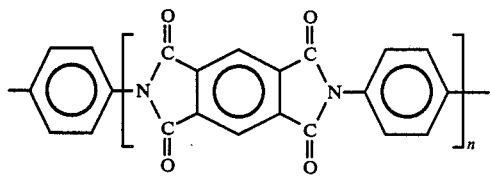

wherein n is 1 or 2.

The solvent for the resin which comprises one or more electron donors preferably comprises an aliphatic ring structure containing an ester or anhydride group and more preferably comprises butyrolactone having the structure:

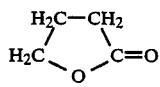

or propylene carbonate having the structure;

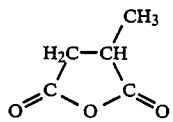

While both butyrolactone and propylene carbonate appear to be quite effective in providing a high strength conductive adhesive with good shelf stability, propylene carbonate is preferred for use in die attach formulations because butyrolactone has been found to produce a by-product of hydroxy butyric acid which is an objectionable contaminant in some integrated circuit assemblies.

Either butyrolactone or propylene carbonate when used with the resin of the invention and silver powder provide a mixture which is stable for long periods with stored at or below room temperature. Other solvents tested, such as dimethylformamide, diglyme, n-methyl pyrollidone, and dimethylsulfoxide, which are ordinarily used when bismaleimide resins and which are recommended in manufacturer's literature give stable solutions with no filler or with most fillers, but gel within short periods of time, even as short as one day, when used with silver filler. While the inventor does not want to be held to any particular theory, the speculation is that this stability problem is caused by the fact that silver powder has a strongly basic (proton acceptor) surface, and acts as a Redux catalyst for solutions of these maleic terminated resins, causing gelation by addition between double bonds. This stability problem is believed to be avoided by using a solvent comprising one or more electron donors. In this regard, two preferred solvents of the invention, butyrolactone and propylene carbonate both have oxygen atoms in their structures which can serve as electron donors.

This invention is also directed to an electronic assembly comprising a semiconductive device, such as a silicon device or chip capacitator, attached to a substrate using the silver-filled paste of the invention and to a method of bonding an electronic device, such as a silicone device or chip capacitator, to a substrate using the silver-filled paste of the invention. In the method of bonding an electronic device to a substrate using the silver-filled paste of the invention, the silver-filled paste is applied onto said substrate, the electronic device is then set into said paste with pressure to form an assembly, and the assembly is then cured at a temperature ranging from about 140°–180° C. This is a one-step, low temperature cure as compared to the two-step cure at high temperature required with the previously existing polyimide die attach adhesives, based on acetylene terminated resins. The silver-filled paste of the invention cures by addition between the reactive end groups, not by a ring closure reaction, which generates water as a by-product of cure. More specifically, depending on use, a dot, square or screened area of the paste is applied on a metallized or bare film (ceramic) substrate, machine dispensing, screen printing or stamping techniques all being useable. The die is attached by placing the die in the center of the wet paste and "setting" it by applying pressure, so that the paste flows about half way up the side of the die and leaves a thin film under the die. Curing of the assembly is then carried out at between 140°–180° C. Optimum curing conditions for best hot strength, for highest Tg and for best performance in pressure cooker tests are about 1 hour in an 180° C. oven. An alternate fast cure schedule, which is used to reduce stress on large dies and where post cure after molding can serve to approach optimum properties, is about 30 minutes at 165° C. For use on pre-soldered copper lead frames the assembly should be cured for 1 hour at 160° C.

The invention is further illustrated by the following non-limiting example.

EXAMPLE 1

A resin of the invention, Kerimid 601, is made by reacting one mole of methylene dianiline with two moles of maleic anhydride. 17 grams of Keramid 601 powder, obtainable from Rhone Poulenc, were dissolved in 17 grams of reagent grade propylene carbonate, by rolling the mixture on a jar mill under a heat lamp for 16 hours until a clear solution was obtained. To this solution was then added 83 grams of silver powder (Metz Silver Flake 15) using a propeller stirrer until a smooth paste was obtained, followed by vacuum mixing to de-air the paste. The paste had a a viscosity at 25° C. of 45,000 cps measured using Brookfield HAT viscometer TC spindle at 5 RPM. If the storage or shipping temperature of the paste is 0° C., then the maximum shelf life is 6 months, if the storage or shipping temperature is 25° C., then the maximum shelf life is 3 weeks and if the storage or shipping temperature is 40° C., then the maximum shelf life is 5 days.

While this invention has been described with reference to its preferred embodiment, other embodiments can achieve the same result. Variations and modifications of the present invention will be obvious to those skilled in the art and it is intended to cover in the appended claims all such modifications and equivalents as fall within the spirit and scope of this invention:

I claim:

1. A silver-filled paste comprising
   (a) silver powder;
   (b) a resin having the formula:

[structure: bismaleimide with N-R-N linkage]

wherein R comprises a divalent linking group; and
   (c) a solvent for the resin which comprises one or more electron donor groups.

2. The silver-filled paste of claim 1 wherein R comprises a divalent linking group which provides an aromatic ring adjacent each of the nitrogen atoms.

3. The silver-filled paste of claim 1 wherein the silver is in flake form.

4. The silver-filled paste of claim 3 wherein the major dimension of the silver flake ranges from 5 to 15 microns and the thickness of the flake is about 1 micron.

5. The silver-filled paste of claim 1 wherein R is selected from the group consisting of:

[structures: phenylene; diphenylmethane; benzophenone; diphenyl ether linked structure with X; diphenyl ether]

wherein X comprises a linking group,

[structure]

, and

[structure: polyimide repeat unit with R$_1$]

wherein R$_1$ is an aromatic group and n is 1 or 2.

6. The silver-filled paste of claim 5 wherein R comprises:

[structure: diphenyl ether-X-diphenyl ether]

wherein x is selected from the group consisting of oxygen, alkylene and carboxyl.

7. The silver-filled paste of claim 5 wherein R comprises

[structure: pyromellitic diimide repeat unit]

wherein n is 1 or 2.

8. The silver-filled paste of claim 1 wherein the solvent comprises butyrolactone.

9. The silver-filled paste of claim 1 wherein the solvent comprises propylene carbonate.

10. The silver filled paste of claim 1 comprising 50–85% by weight of the silver powder, 15–50% by weight of the resin and 15–30% by weight of the solvent.

11. A silver-filled paste comprising:
    (a) 50–85% by weight of silver powder;
    (b) 15–50% by weight of a resin having the formula:

[structure: N,N'-(methylenedi-p-phenylene)bismaleimide]

(c) 15–30% by weight of butyrolactone.

12. A silver-filled paste comprising:
    (a) 50–85% by weight of silver powder;
    (b) 15–50% by weight of a resin having the formula:

[structure: N,N'-(methylenedi-p-phenylene)bismaleimide]

(c) 15–30% by weight of propylene carbonate.

* * * * *